(12) United States Patent
Chen et al.

(10) Patent No.: US 6,288,587 B1
(45) Date of Patent: Sep. 11, 2001

(54) CMOS PULSE SHRINKING DELAY ELEMENT WITH DEEP SUBNANOSECOND RESOLUTION

(75) Inventors: Poko Chen, Taipei; Shen-Iuan Liu, Keelung; Jing-Shown Wu, Taipei, all of (TW)

(73) Assignee: National Science Council of Republic of China, Taipei (TW)

( * ) Notice: Subject to any disclaimer, the term of this patent is extended or adjusted under 35 U.S.C. 154(b) by 0 days.

(21) Appl. No.: 09/287,101

(22) Filed: Apr. 7, 1999

(51) Int. Cl.$^7$ .................................................. H03H 11/26
(52) U.S. Cl. ........................................ 327/261; 327/286
(58) Field of Search .................................... 327/149–151, 327/153, 158–161, 176, 261–265, 270–271, 273, 276–279, 284–286, 299

(56) References Cited

U.S. PATENT DOCUMENTS

| | | | |
|---|---|---|---|
| 4,742,254 | * | 5/1988 | Tomisawa ............................ 327/284 |
| 5,121,014 | * | 6/1992 | Huang .................................. 327/276 |
| 5,151,622 | * | 9/1992 | Thrower et al. ....................... 326/71 |
| 5,229,668 | * | 7/1993 | Hughes, Jr. et al. ................ 327/271 |
| 5,936,444 | * | 8/1999 | Pathak et al. ........................ 327/143 |

OTHER PUBLICATIONS

Rahkonen et al, Pulsewidth measurements using an integrated pulse shrinking delay line, IEEE, pp. 578–581, 1990.*

* cited by examiner

*Primary Examiner*—My-Trang Nu Ton
(74) *Attorney, Agent, or Firm*—Bacon & Thomas, PLLC

(57) ABSTRACT

A CMOS pulse shrinking delay element with deep subnanosecond resolution applicable to a Time-to-Digital Converter (TDC) can control its pulse shrinking or expanding capability be adjusting the dimension ratio between internal adjacent elements. This eliminates the need in prior CMOS pulse shrinking delay elements to adjust an external bias voltage or continuously calibrate the element in order to control pulse shrinking or expanding capabilities, facilitates simplification of circuits using the delay element, permits more precise design and control of the pulse shrinking or expanding capabilities of every element in a TDC circuit, and in practice reduces single shot errors in a cyclic TDC utilizing the pulse shrinking delay element to on the order of ten picoseconds, resulting in a TDC having extremely fine resolution, excellent accuracy, low power consumption, and low sensitivity to supply voltage and ambient temperature variations.

1 Claim, 10 Drawing Sheets

| Item | linear TDC[4] | FPGA-based TDC[7] | The present TDC |
|---|---|---|---|
| LSB width | 780 ps | 200 ps | 68 ps |
| single shot error | 3.8 LSB (3 ns) | < 1.3 LSB | < 0.8 LSB |
| continuous calibration | yes | no | no |
| Bias voltage control | yes | no | no |
| trial-and-error design | no | yes | no |
| supply voltage | 4.5-5.5 V | unknown | 1.5-4.5 V |
| power consumption | 15 mW | unknown | under 3.3v,1uW for idle 1.2mW for 38% operation duty |
| chip size | 2.9mm × 2.5mm | unknown | 0.35mm × 0.09mm |

CMOS PULSE SHRINKING DELAY ELEMENT WITH DEEP SUBNANOSECOND RESOLUTION

BACKGROUND OF THE INVENTION

1. Field of the Invention

This invention relates to a CMOS pulse shrinking delay element with deep subnanosecond resolution, and particularly to a CMOS delay element that can control pulse shrinking or expanding merely by changing an aspect ratio or driving capability of adjacent internal elements. A cyclic CMOS Time-to-Digital Converter (TDC) built with the present element has the advantages of extremely fine resolution, low power consumption, and elimination of the need for of bias voltage adjustment or continuous calibrations.

2. Description of the Prior Art

When the IC fabrication process wasn't yet matured, an obsolete subnanosecond order TDC (Time-to-Digital Converter) was usually constructed with high speed ECL components resulting in a relatively large Euro-I printed circuit board with power consumption as high as 5W that was impractical for various portable system applications.

Hence, in order to overcome the abovesaid defects, employment of low power consumption CMOS fabrication process to integrate high density TDC on a substrate seemed to be the inevitable trend. As shown in FIGS. 1, 2, a linear CMOS TDC has been developed since the end of 1995, wherein the pulse shrinking delay element 3 consists of two NOT gates; the first NOT gate contains transistor P1 and N1, the second, P2 and N2 respectively. As the maximum conduction current of the first NOT gate is controlled by the gate bias voltage ($V_{bias}$) of transistor N3, i.e., the lower the $V_{bias}$ the lesser the current in N3 as well as in the first NOT gate, then accordingly, a $V_{mid}$ in flatter slope is formed between those two NOT gates that may shrink the input pulse significantly. In other words, the degree of pulse shrinking in each delay element is controlled by adjusting $V_{bias}$ when an input pulse $T_{in}$ is propagated through a delay line.

By virtue of the Delay-Locked Loop (DLL) 1, the prior linear CMOS TDC can be continuously calibrated via a $V_{bias}$ adjustment to enable an input reference pulse $T_{ref}$ to disappear exactly at the last pulse shrinking delay element 3, which is aggregated to form a delay line 2a. Assuming N is the number of total matched delay elements 3, then the pulse shrinking time in each delay element 3 will be $T_{ref}/N$ theoretically.

The continuous calibration will be paused temporarily in the case a time measurement is required, and a pending input pulse $T_{in}$ is applied to the input terminal of the TDC for measurement. Assuming the pulse $T_{in}$ disappears at the nth element of the delay line 2a, the measured width of $T_{in}$ would be $n \times T_{ref}/N$. For example, in a realized circuit where N equals 64 and pulse width of $T_{ref}$ is 50 nanoseconds the resolution of the CMOS TDC is calculated as 50 nanosecond/64=0.78 nanosecond, which represents the pulse width of the lowest significant bit (LSB).

The abovesaid CMOS TDC circuit can basically meet the requirements of low power consumption, high precision portable TDC systems, however, some defects in need of improvement are listed below:

1. As continuous calibration is required to assure that the reference pulse $T_{ref}$ disappear exactly at the last delay element of the delay line 2a, logic gates in delay line 2a are kept in a toggling state, wasting considerable power.
2. The considerable length and area occupied by delay line 2a in a TDC chip may deteriorate the matching of the pulse-shrinking delay elements to badly affect measurement accuracy.
3. A length-doubled delay line 2a will be required to merely increase an output bit, and moreover, due to the geometrical confinement of a TDC chip in length and width, an overlong delay line 2a has to be folded into segments that may further deteriorate the matching of delay elements. Hence, the maximum number of output bits of a linear CMOS TDC is limited to 6 or 7.
4. As shown in FIG. 2, when the pulse width of input $T_{in}$ is too narrow, it's possible that $V_{mid}$ cannot transit a state below the threshold voltage of the second NOT gate in time and consequently no $V_{out}$ output can be obtained. This phenomenon implies that the pulse shrinking time at the last stages (particularly, at the last stage) in a delay line 2a is far larger than that in the preceding stages to worsen the TDC measurements accuracy.

In view of the above imperfections, a cyclic CMOS TDC has been proposed since 1997. As shown in FIG. 3, the linear delay line 2a has been replaced by a cyclic delay line 2b that can shrink the input pulse $T_{in}$ by a specific width per cycle till $T_{in}$ disappears to obtain high resolution of the TDC by proper control of $V_{bias}$.

The improvements made by a cyclic CMOS TDC are:

1. The input pulse $T_{in}$ will circulate the delay line 2b thoroughly in each cycle to create a constant amount of pulse shrinking per cycle in spite of element mismatch in the delay line 2b.
2. It is unnecessary for a cyclic CMOS TDC to do what a linear CMOS TDC has to—let a reference pulse $T_{ref}$ disappear exactly at the last element (or a designated element) in delay line 2b. Hence, the continuous calibration is needless and the cyclic CMOS TDC can be shut down between measurements for power saving.
3. A linear CMOS TDC requires two identical linear delay lines 2a with two cooperative DLLs 1 respectively for performing continuous calibration, while a cyclic CMOS TDC only requires one cyclic delay line 2b without any DLL 1 that can lower chip size and fabrication cost significantly.
4. The delay line 2a must be doubled for a linear CMOS TDC to increase one extra output bit; for a cycling CMOS TDC, it is only necessary to add one more bit to Counter 4 only and properly adjust $V_{bias}$ to get enough accuracy without increasing cost.
5. As mentioned above, the width of the input pulse $T_{in}$ is shrinks more rapidly in the last stages in the linear delay line 2a, which is technically beyond remedy so far. However, it may be deemed as a measurement offset and waived in the cyclic CMOS TDC to highly improve measurement accuracy.
6. For single shot measurement, the cyclic CMOS TDC reveals a stable result with resolution as high as 286 picoseconds and error lower than a half of the resolution (143 psec). Thus, it is unnecessary to average many measurements to improve accuracy. On the contrary, the linear CMOS TDC indicates fluctuated output data with single shot error as large as 3 nanoseconds, and therefore, requires statistical averaging to reduce the measurement error.

To summarize the abovesaid, a cyclic CMOS TDC can indeed eliminate defects derived from the linear CMOS TDC. Nevertheless, a proper external bias voltage is needed to obtain a decent resolution for the cyclic CMOS TDC at the initial calibration. It seems troublesome and lacks of automation, and more importantly, the adjustment of $V_{bias}$ for further accuracy improvement of the TDC becomes too trivial and impractical.

Though a subsequent FPGA TDC with resolution of about 200 picoseconds requires no continuous calibration, nor $V_{bias}$ adjustment, its single shot error is larger than ½ LSB width and a vital trial-and-error design process is required, and it becomes time-consuming to make the TDC, which is disadvantageous for mass production. The patented inventions in USA relating to Time-to-Digital Converter since 1975 are listed below for reference:

(1) S. Kinbara, et al. "Counting Circuit System for Time-to-digital Converter," U.S. Pat. No. 4,090,191, May 1978.
(2) J. Genat, et al. "Ultra High-speed Time-to-digital Converter," U.S. Pat. No. 4,719,608, January 1988.
(3) D. H. Orlov, et al. "Circuit For Measuring Elapsed Time Between Two Events," U.S. Pat. No. 5,121,012, June 1992.
(4) Rapeli et al. "Method and circuitry for demodulation of angle modulated signals by measuring cycle time," U.S. Pat. No. 5,270,666. Dec 1993.

In view of the above-described imperfections after years of constant effort in research, the inventors of this invention have consequently developed and proposed this improved mechanism pertaining to the subject matter.

SUMMARY OF THE INVENTION

This invention is proposed to provide a CMOS pulse shrinking delay element with deep subnanosecond resolution, which doesn't require any bias voltage adjustment, continuous calibration or trial-and-error design process. By adjusting the dimension ratio of internal adjacent elements, its pulse shrinking capability can be precisely designed and controlled, and a cyclic CMOS TDC based on the proposed element will be characterized by fine resolution on the order of 10 picosecond, low power consumption, minimized substrate area, and low voltage and temperature sensitivity, which are favorable to portable systems.

Bearing the abovesaid merits, the present delay element comprises two identical gates and another interpolated gate with different size or driving capability to form a triunity element, wherein the pulse shrinking capability is controlled by the dimension ratio of internal adjacent gates instead of an external bias voltage in a corresponding prior element.

BRIEF DESCRIPTION OF THE DRAWINGS

For better understanding to the present invention, together with further advantages or features thereof, at least one preferred embodiment will be elucidated below with reference to the annexed drawings in which:

FIGS. 14A and 14B are graph of the effect imposed by temperature on resolution and measurement range of a cyclic CMOS TDC based on the present element;

DETAILED DESCRIPTION OF THE PREFERRED EMBODIMENT

Figure 1:
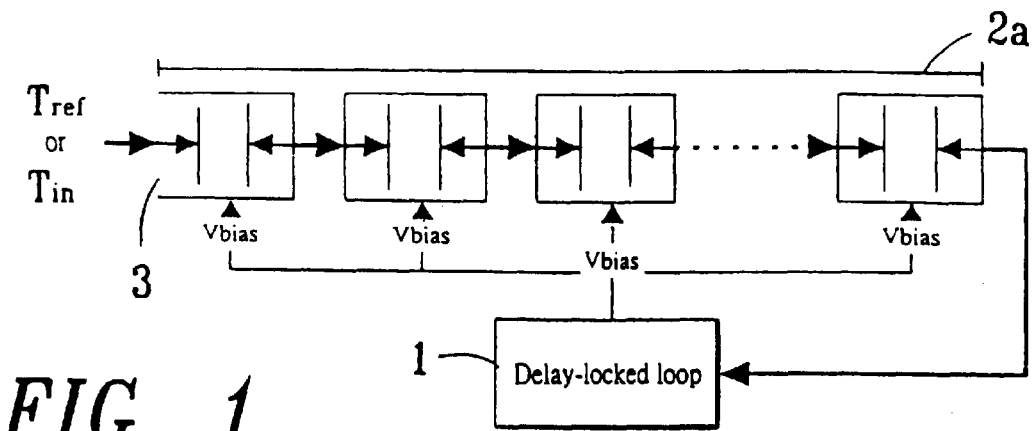
FIG. 1 is a schematic view showing the main circuit of a prior linear CMOS TDC.
Figure 2:
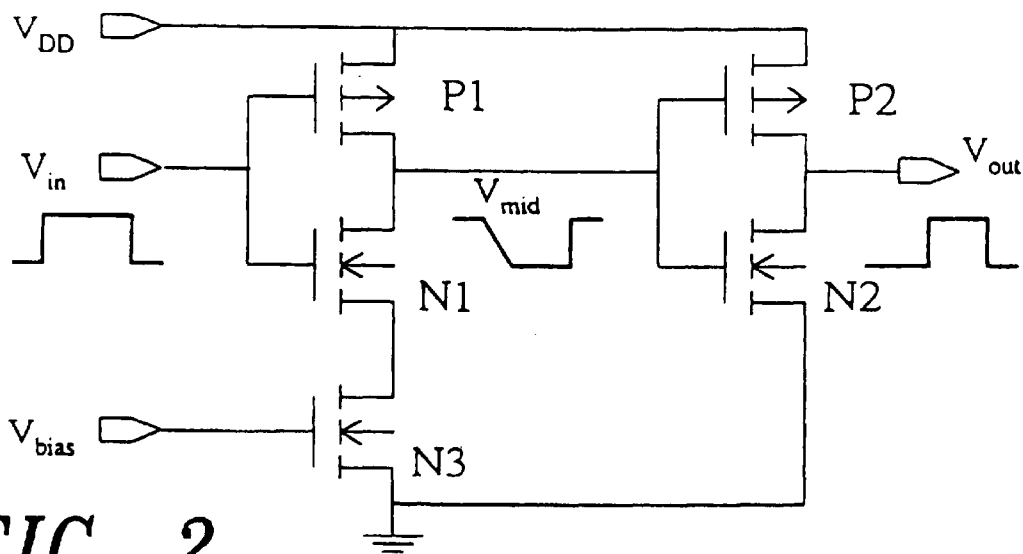
FIG. 2 is a schematic view showing in detail the circuit of a prior pulse shrinking delay element.
Figure 3:
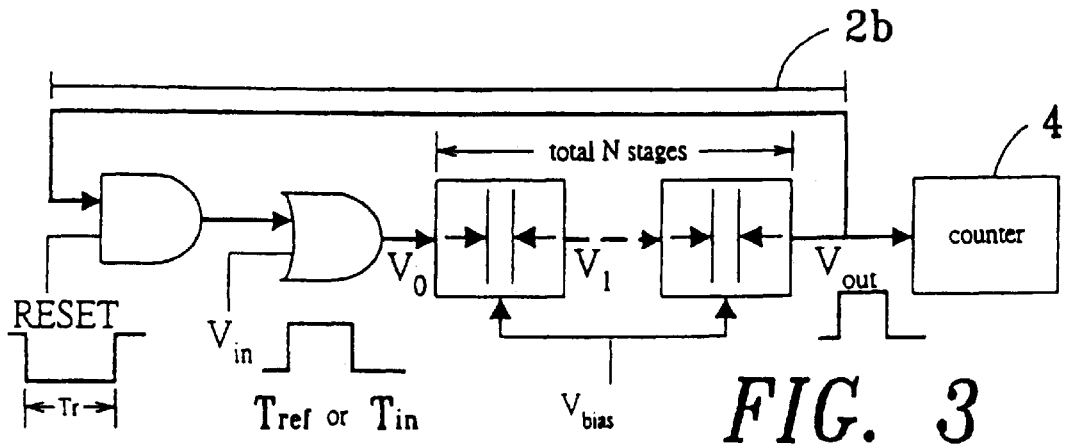
FIG. 3 is a schematic view showing the main circuit structure of a prior cyclic CMOS TDC.
Figure 4A:
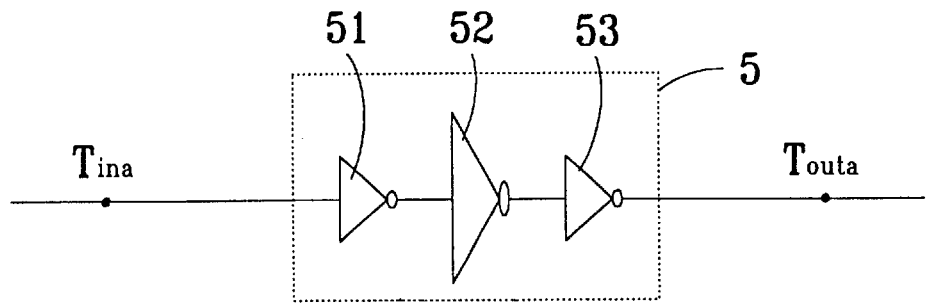
FIGS. 4A–4C are a schematic view showing the structure and the signal transmission flow of the present pulse shrinking delay element.
Figure 4B:
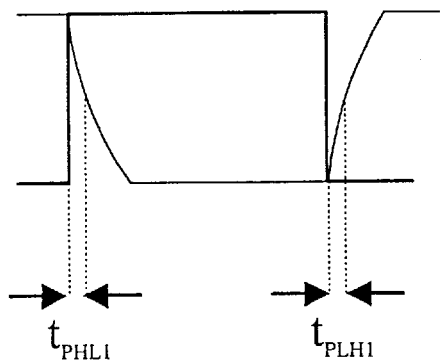
Figure 4C:
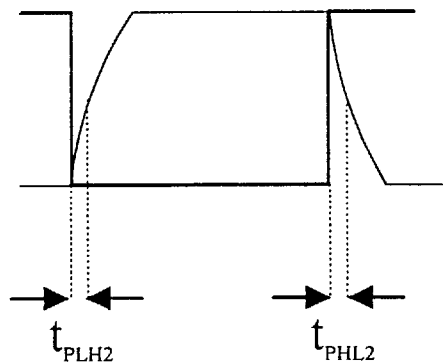

FIG. 4 illustrates the structure of the pulse shrinking delay element of this invention and its signal flow diagram. The present pulse shrinking delay element 5 consists of 3 NOT gates as shown in FIG. 4(A), wherein all of the NOT gates are identical except the inhomogeneous second NOT gate 52 with different dimension or driving capability. The applied input pulse $T_{ina}$ will be shrunk by a designated width and propagates to the output terminal to form output pulse $T_{outa}$ after a specified delay time, the shrinking or expanding capability depend on the dimension ratio between the adjacent elements instead of the adjustment of an external bias voltage.

For convenience we are intended to derive only the first order approximate formulas for the pulse shrinking mechanism by assuming all inputs to the NOT (rates are of stepwise pulses. As shown in FIG. 4(B), when the pulse goes from the first homogeneous NOT gate 51 to the second inhomogeneous NOT gate 52, the falling time and rising time are:

$$t_{PHL1} = \frac{2C_2 V_{TN}}{K_{N1}(V_{DD} - V_{TN})^2} + \frac{C_2}{K_{N1}(V_{DD} - V_{TN})} \ln\left[\frac{1.5V_{DD} - 2V_{TN}}{0.5V_{DD}}\right] \quad (1)$$

$$t_{PLH1} = \frac{-2C_2 V_{TP}}{K_{P1}(V_{DD} + V_{TP})^2} + \frac{C_2}{K_{P1}(V_{DD} + V_{TP})} \ln\left[\frac{1.5V_{DD} + 2V_{TP}}{0.5V_{DD}}\right] \quad (2)$$

respectively, where $K_{N1}$ and $K_{P1}$ are the transconductance parameters of n-type and p-type transistors in the first NOT gate 51, and $C_2$ is the equivalent input capacitance of the second NOT gate 52. Assuming $-V_{TP}=V_{TN}$, the difference in pulse width of an input pulse propagated from the first homogeneous NOT gate 51 to the second inhomogeneous NOT gate 52 can be calculated as $t_{PLH1} - t_{PHL1}$:

$$\Delta W_1 = \qquad (3)$$

$$C_2\left(\frac{1}{K_{P1}} - \frac{1}{K_{N1}}\right)\left[\frac{2V_{TN}}{(V_{DD} - V_{TN})^2} + \frac{1}{(V_{DD} - V_{TN})}\ln\left(\frac{1.5V_{DD} - 2V_{TN}}{0.5V_{DD}}\right)\right]$$

Similarly, the pulse shrinking time for the input pulse propagating from the second inhomogeneous NOT gate 52 to the third homogeneous NOT gate 53 can be calculated as $t_{PHL2} - t_{PLH2}$:

$$\Delta W_2 = -C_2\left(\frac{1}{K_{P2}} - \frac{1}{K_{N2}}\right) \qquad (4)$$

$$\left[\frac{2V_{TN}}{(V_{DD} - V_{TN})^2} + \frac{1}{(V_{DD} - V_{TN})}\ln\left(\frac{1.5V_{DD} - 2V_{TN}}{0.5V_{DD}}\right)\right]$$

where C3=C1. The total pulse shrinking time before and after passing through the present element is:

$$\Delta W = \Delta W_1 + \Delta W_2 = \partial_i\left[C_2\left(\frac{1}{K_{P1}} - \frac{1}{K_{N1}}\right) - C_1\left(\frac{1}{K_{P2}} - \frac{1}{K_{N2}}\right)\right] \qquad (5)$$

where $C_1$, $K_{P1}$, $K_{N1}$ are the equivalent input capacitance and transconductance parameters of those two identical NOT gates 51 and 53, $C_2$, $K_{P2}$, $K_{N2}$ are those of the interpolated inhomogeneous NOT gate 52; and $$\partial_i = \frac{2V_{TN}}{(V_{DD} - V_{TN})^2} + \frac{1}{V_{DD} - V_{TN}}\ln\left(\frac{1.5V_{DD} - 2V_{TN}}{0.5V_{DD}}\right)$$

is a constant factor which is more or less layout independent. Thus, by varying the dimension ratio of the NOT gates, the pulse shrinking capability of the present element can be easily controlled. For example, in the case that transistors in these three NOT gates are made of the same length (L), while the width (W) of the transistors in the second inhomogeneous NOT gate 52 is β-times of that in the rest two homogeneous NOT gates, then $K_{N2} = \beta \times K_{N1}$, $K_{P2} = \beta \times K_{P1}$, $C_2 = \beta \times C_1 \times C_3$, and formula (5) may be further simplified as:

$$\Delta W = \left(\beta - \frac{1}{\beta}\right)C_1\left(\frac{1}{K_{P1}} - \frac{1}{K_{N1}}\right)\partial_i \qquad (6)$$

Figure 5:
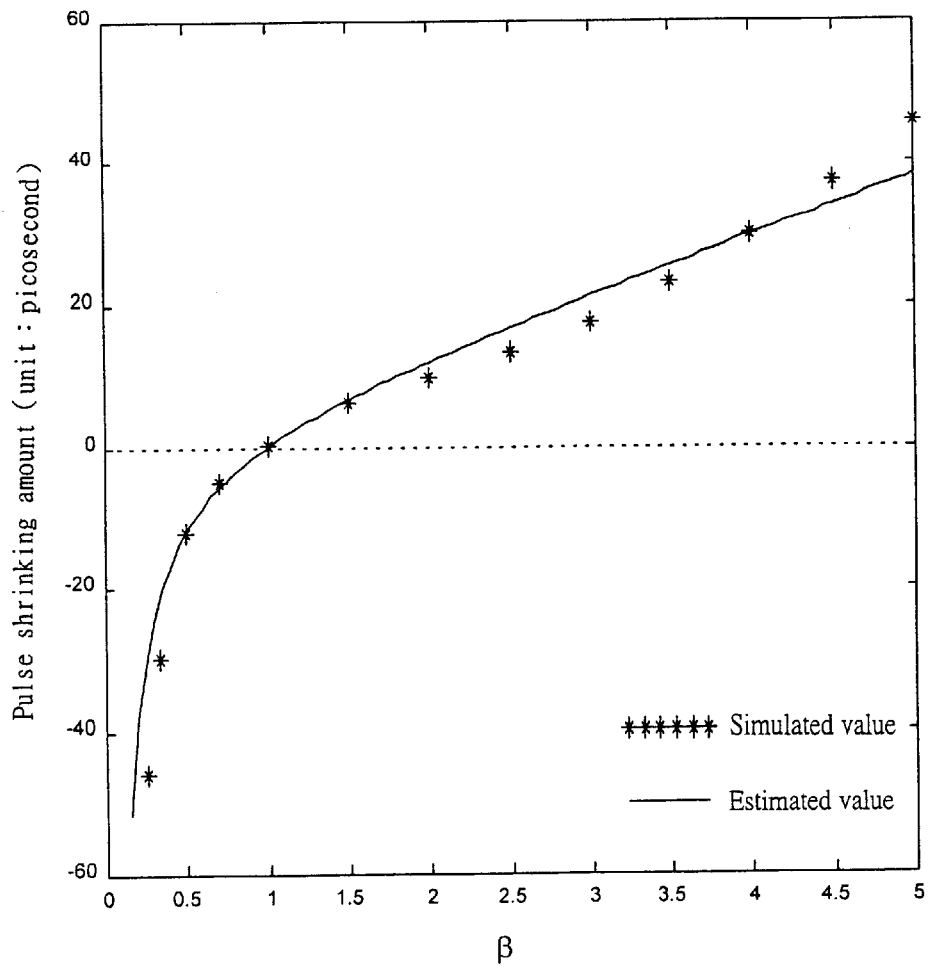
FIG. 5 is a diagram showing the effect of the dimension ratio β between internal gates on the pulse shrinking capability of the present pulse shrinking delay element.

If β=1, it means all those three NOT gates are identical, in which case ΔW=0, and input pulse will be neither shrunk nor enpanded, if β≠1, the shrinking or expanding of the input pulse depends on the value of β. For example, let the size of p-type and n-type transistors in the first NOT gate 51 and the third NOT gate 53 be 3 μm/1 μm and 1 m/1 μm respectively, the simulation result for different β value is shown in FIG. 5 The result obtained is well conformed with formula (6). For more accurate analysis, some other factors must be taken into consideration, such as the rising and falling edge of the input pulse actually having an of exponential-decay rather than being stepwise; the impedance reflection effect in serial stages; and the dependence of the threshold voltage $V_T$ on the device geometry, etc.

Figure 6:
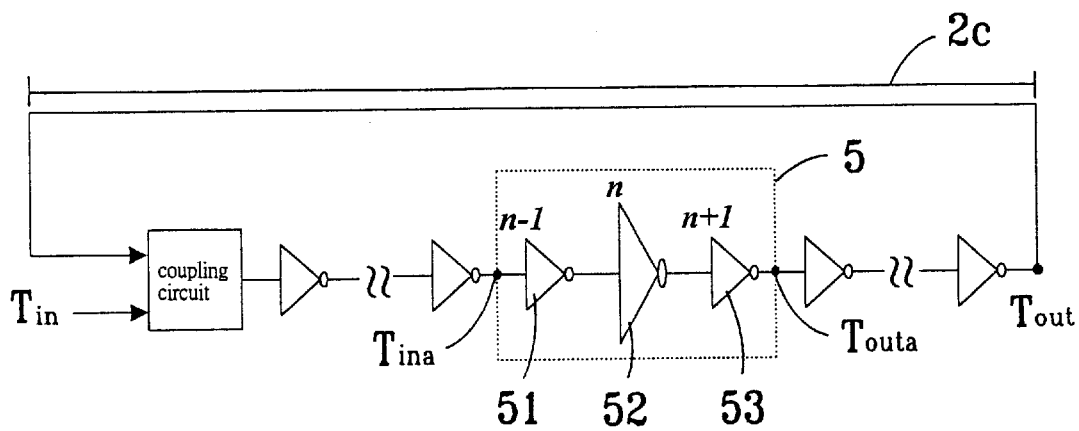
FIG. 6 is an embodiment of the cyclic delay line based on the present pulse shrinking delay element.

FIG. 6 is an embodiment of a cyclic delay line of this invention, wherein an inhomogeneous NOT gate 52 with different dimension or driving capability is inserted into the cyclic delay line 2c constructed by homogeneous NOT gates in series. The delay line 2c is used to shrink the input pulse $T_{IN}$ to a desired extent and delay it by a designated time period to form the output pulse $T_{OUT}$. The output pulse $T_{OUT}$ is cycled back to the input of the delay line 2c via the coupling circuit, and the shrinking or expending capability of this construction can be controlled by proper arrangement of the dimension ratio between the inhomogeneous NOT gate 52 and its adjacent gates. It is expectable to improve the abovesaid delay line 2b in a prior cyclic TDC to obtain easier design and control of pulse shrinking and to waive the need of external bias voltage adjustment by virtue of this invention.

Figure 7:
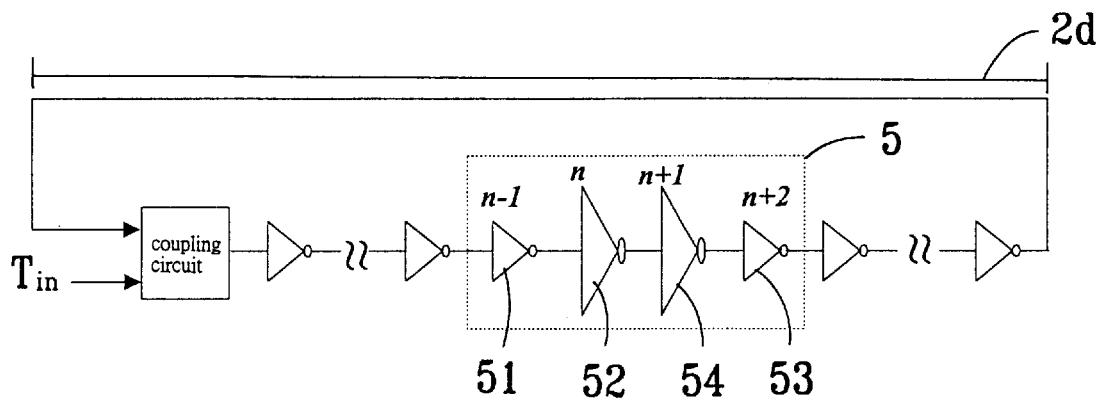
FIG. 7 is a schematic view of another type of cyclic delay line comprising two inhomogeneous elements.

FIG. 7 indicates an extended application of the cyclic delay line in FIG. 6. Though the number of inhomogeneous gates in the delay line is increased to two, the input pulse still undergoes different rising and falling times at the interface boundaries around the inhomogeneous gates. The pulse shrinking mechanism still works, and the number of the inhomogeneous gates in the delay line can be varied favorably on demand.

Figure 8:
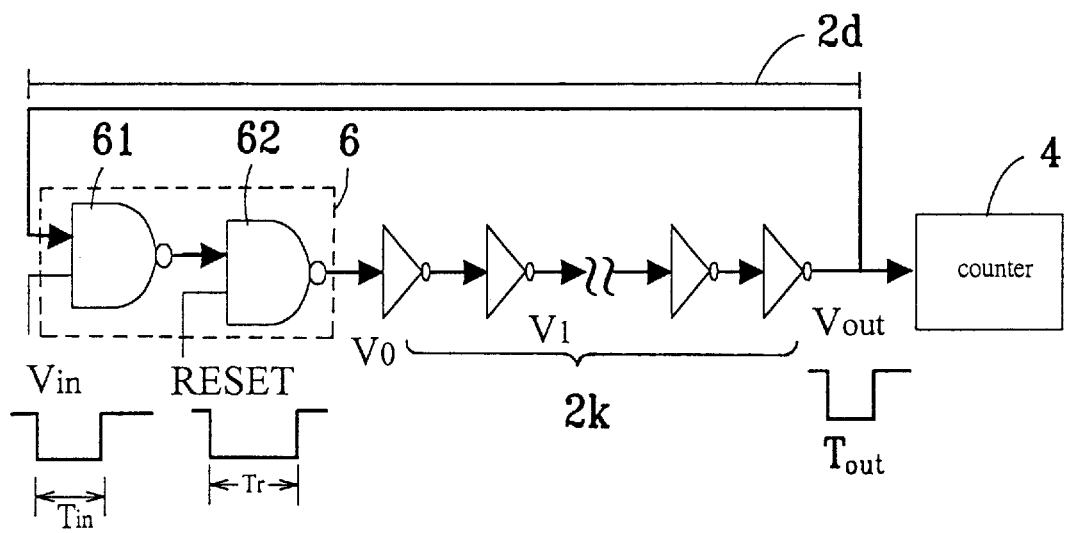
FIG. 8 is a schematic view showing the circuit of a cyclic CMOS TDC constructed by the present pulse shrinking delay element.

A cyclic CMOS TDC shown in FIG. 8 is derived directly from the structure shown in FIG. 7, wherein a coupling control circuit 6 consists of two NAND grates 61 and 62; the output pulse $T_{out}$ is coupled back to the input end of the delay line by gate 61 for pulse shrinking in the next cycle; and the other NAND gate 62 provides a RESET terminal for resetting the delay line 2d. To simplify the TDC circuit, those coupling NAND gates 61 and 62 not only can form the coupling circuit 6 but also serve as inhomogeneous elements in delay line 2d, similar to elements 52 and 54 in FIG. 7 Counter 4 is used to count the circulation times of pulse $T_{IN}$ in the cyclic delay line 2d to indicate the measurement output of the time-to-digital conversion. The cyclic delay line 2d comprises 2k (even number) homogeneous NOT gates as well as two inhomogeneous NAND gates 61 and 62 to shrink the input pulse $T_{IN}$ by a specific amount from cycle to cycle until it vanishes.

Figure 9:
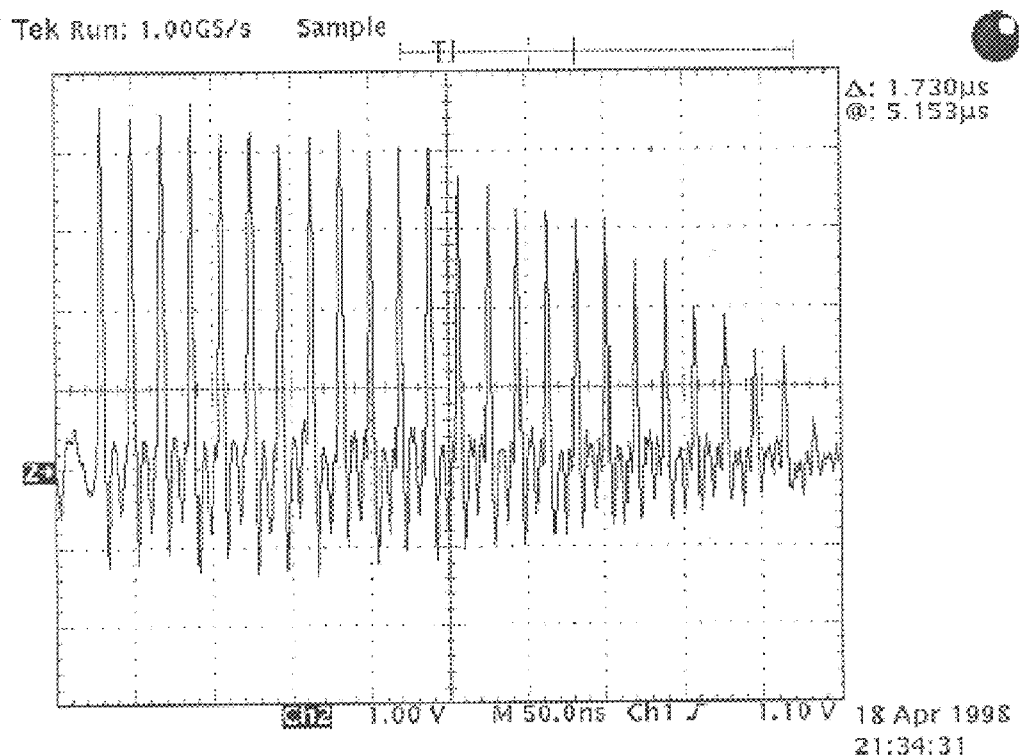
FIG. 9 is the reverse output waveform measured from a cyclic CMOS TDC based on the present element.

FIG. 9 indicates the measured reverse output waveform of the cyclic CMOS TDC based on this invention for a narrow $T_{IN}$ which is gradually shrunk to final disappearance in in compliance with our inference.

If $T_{cyclic}$ represents the cycle period for the input pulse to circulate the delay line 2d once, then the largest width of input pulse $T_{IN}$ must be equal to or less than $T_{cyclic}$, otherwise, the whole delay line 2d will be entrapped into a failure state $V_0 = V_1 = \ldots = _{out}$=LOW. In other words. $T_{cyclic}$ is the maximum measurement range of the cyclic CMOS TDC based on this invention. When a wider TDC measurement range is desired, the delay line 2d should be lengthened. Besides, the initial calibration of the cyclic CMOS TDC of this invention is just the same as that of the prior cyclic CMOS TDC Suppose N is the count obtained from a reference pulse $T_{ref}$ by the present TDC, and N' is that from $2T_{ref}$ (by dividing the frequency of $T_{ref}$ by 2), the effective resolution ca and measurement offset $T_{offset}$ of the present TDC will be:

$$\alpha = \frac{T_{ref}}{N' - N} \qquad (7)$$

$$T_{offset} = \frac{N' - 2N}{N' - N}T_{ref} \qquad (8)$$

The measurement width of an input pulse $T_{IN}$ with a measured count is is:

$$T_{IN} = \frac{n + N' - 2N}{N' - N}T_{ref} \qquad (9)$$

Figure 10:
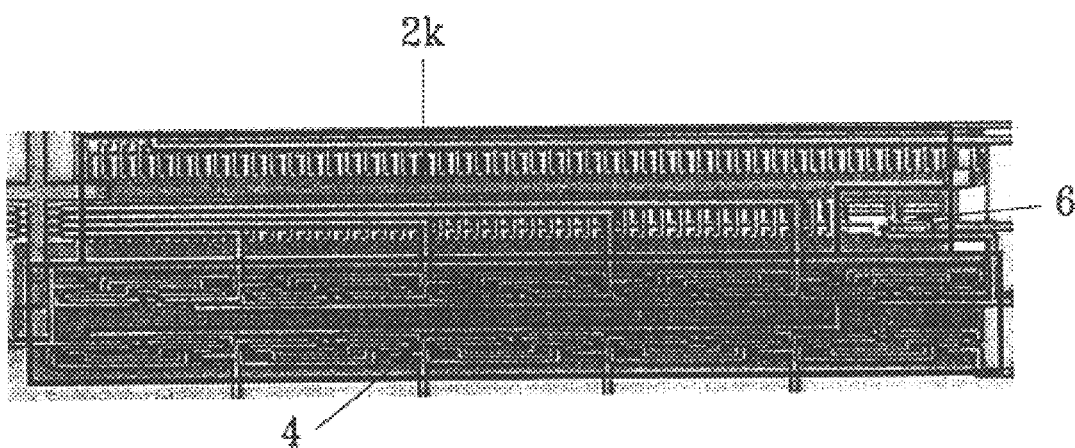
FIG. 10 is an enlarged micro-photograph showing a realized IC of the cyclic CMOS TDC based on the present element.

FIG. 10 indicates the enlarged micro-photograph of the realized cyclic CMOS TDC IC shown in FIG. 8 based on this invention, which is fabricated by the 0.35μ SPDM process, and wherein the aspect ratios of adopted transistors are 12 μm/1 μm for p-MOS and 8 μm l/1 μm for n-MOS respectively in those two NAND gates of the control circuit 6; the delay line 2k comprises 86 homogeneous NOT gates with aspect ratios 6 μm/1 μm for p-MOS and 2m/1 μm for n-MOS respectively; and a 10-bit ripple counter 4 is included to form a total chip area of 350 μm×90 μm (I/O pads excluded), far smaller than any prior CMOS TDC. Moreover, the idle current of the TDC IC is mere 0.3 μA under 3.3 V power supply. and an average conduction current is no more than 370 μA under measurement rate 100 k/sec and output code 200 (the ratio of operation time over idle time is 3.8 μs/6.2 μs).

Figure 11:
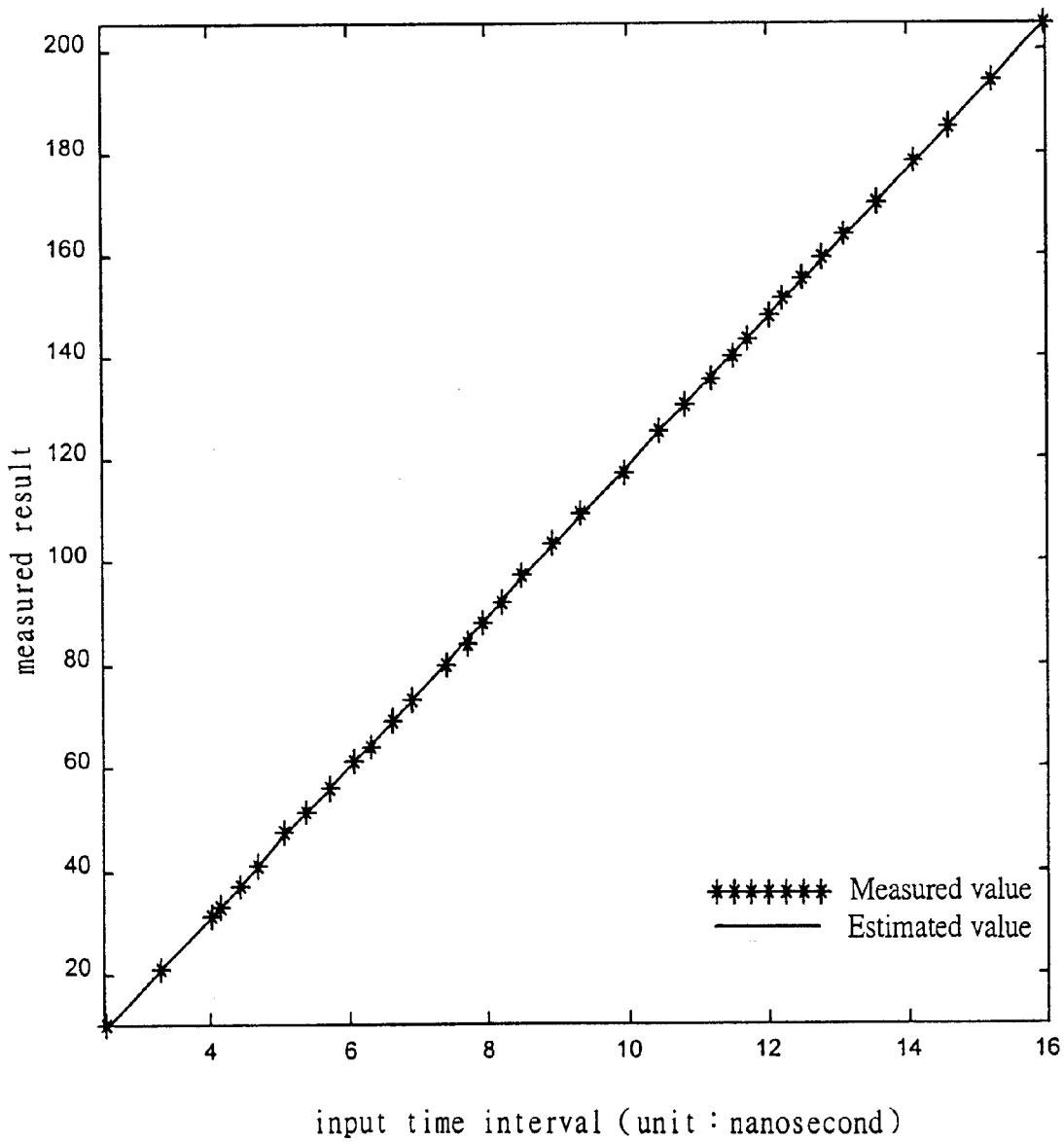
FIG. 11 is a graph of the single shot measurement result of a cyclic CMOS TDC based on the present element.

FIG. 11 depicts the single-shot measurement results along with the theoretical prediction line of a cyclic CMOS TDC based on this invention. To explore the effective resolution of the new cyclic TDC, a series of input pulses with different width were sent to this TDC for coding. The same input pulses were also measured by a Standford Research System SR620 universal counter and a Tektronix TDS680B real-time digital oscilloscope for reference. Though, no calibration is done during the whole measurement process, the experimental data agrees with the linear prediction very well. The effective LSB width is calculated by Eq. (9) to be 68 picoseconds, very close to the simulated value and far below the record 286 picoseconds—the lowest of the prior CMOS TDCs.

Figure 12:
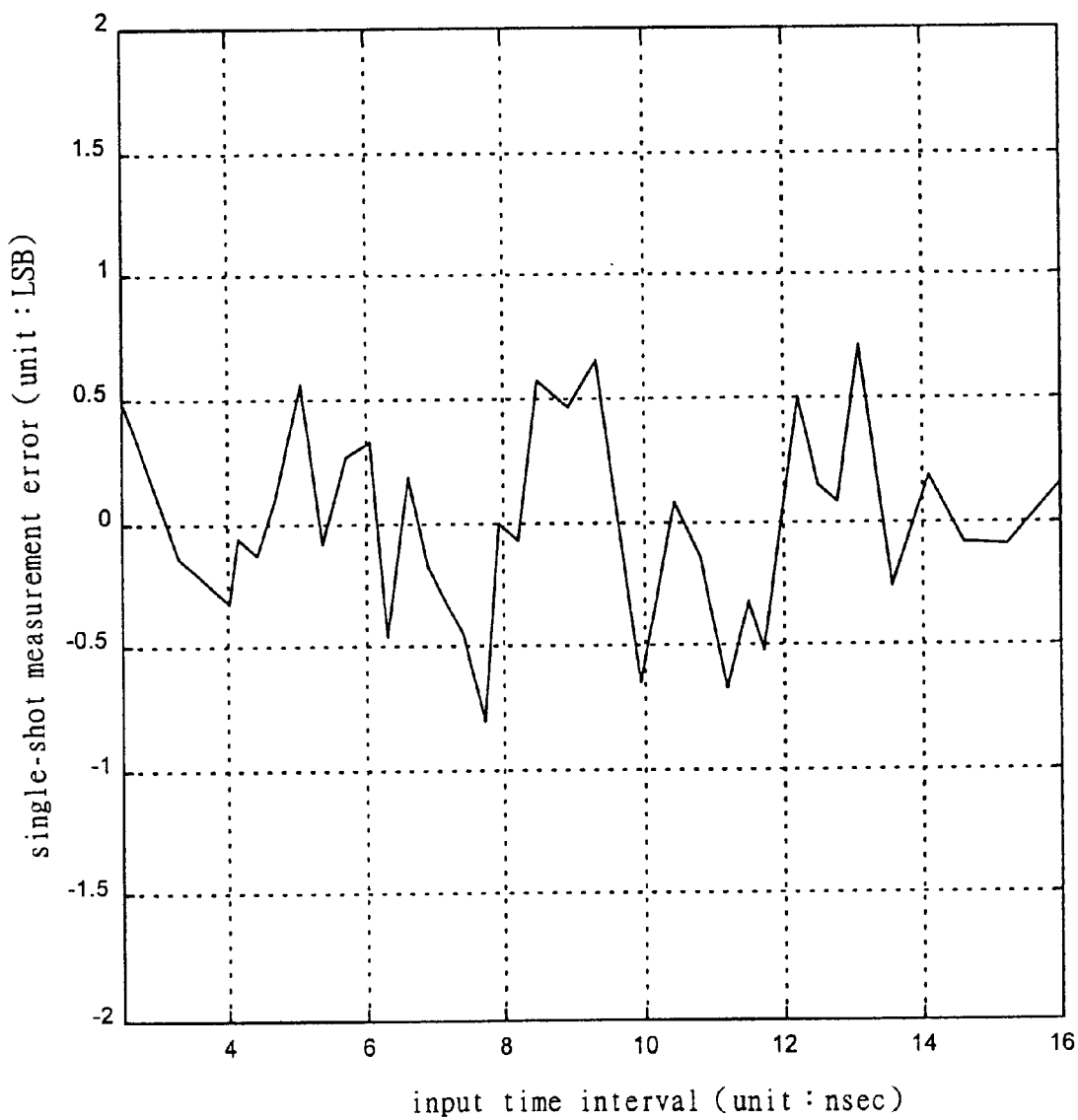
FIG. 12 is a graph of the single shot measurement error of a cyclic CMOS TDC based on the present element.

FIG. 12 shows the error between the single-shot measurements and the theoretical calculation. All the single-shot errors are around ½ LSB width (34 ps). In reality, the TDC with cyclic delay line structure possesses perfect linearity It is reasonable to postulate that most of the errors, corresponding to such deep sub-nanosecond resolution, may be induced by the jitter effect of the pulse generator and the inherent measurement error of the universal counter. The dead time of single-shot measurements is at most a few microseconds, depending on the width of the measured pulse. A measurement rate of 100 KHz at least is promised for the present TDC.

Figure 13A:
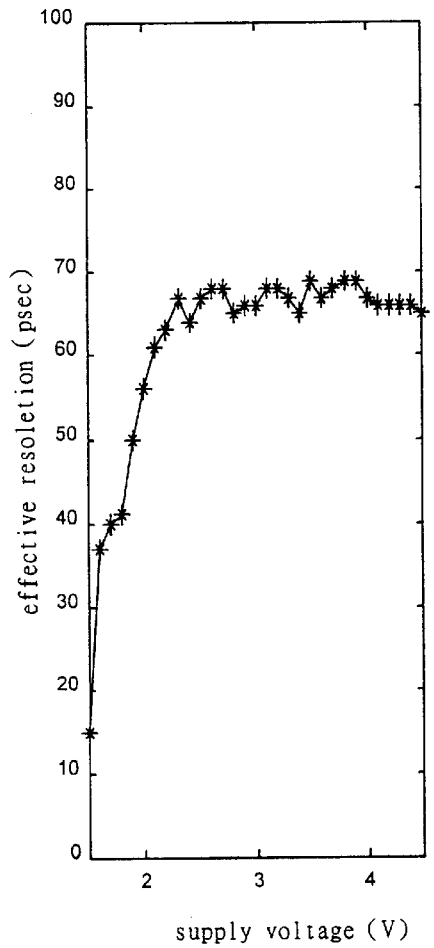
FIGS. 13A and 14A are graph of the effect imposed by supply voltage on resolution and measurement range of a cyclic CMOS TDC based on the present element.
Figure 13B:
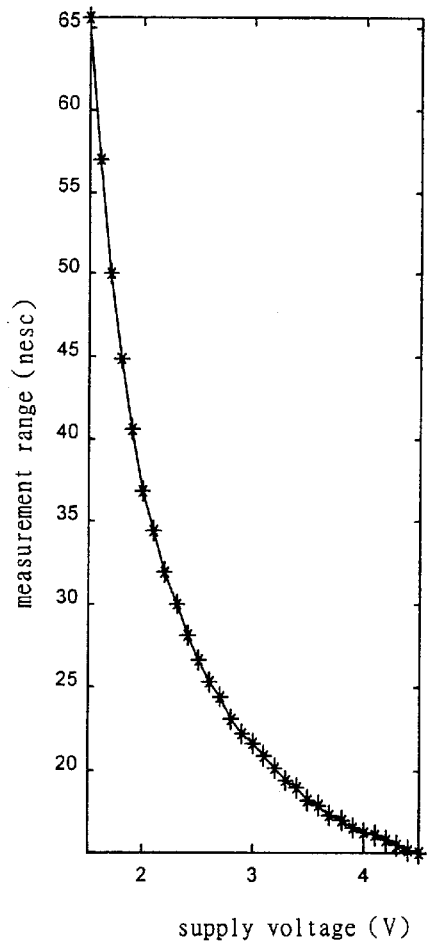

FIG. 13 shows the supply voltage sensitivity of the present cyclic CMOS TDC. To verify the supply voltage dependence of the new TDC, another series of experiments were conducted for supply voltages ranging from 1.5 V to 4.5 V (the maximum supply voltage for 0.35 μm SPDM chips) with 0.1 V increment. For each supply voltage, two different single-shot pulses were coded by the TDC and the effective resolution was estimated as the ratio of the pulse width difference over the output code difference. The present TDC can sustain fine resolution around 65~69 picoseconds for a wide supply voltage range of 2.5 V to 4.5 V, therefore, it is quite insensitive to supply voltage variation. The only feature seriously affected by the supply voltage variation is the measurement range. If necessary, a built-in multiplexer may be used to alter the effective delay line length to accommodate the measurement range variation.

Figure 14A:
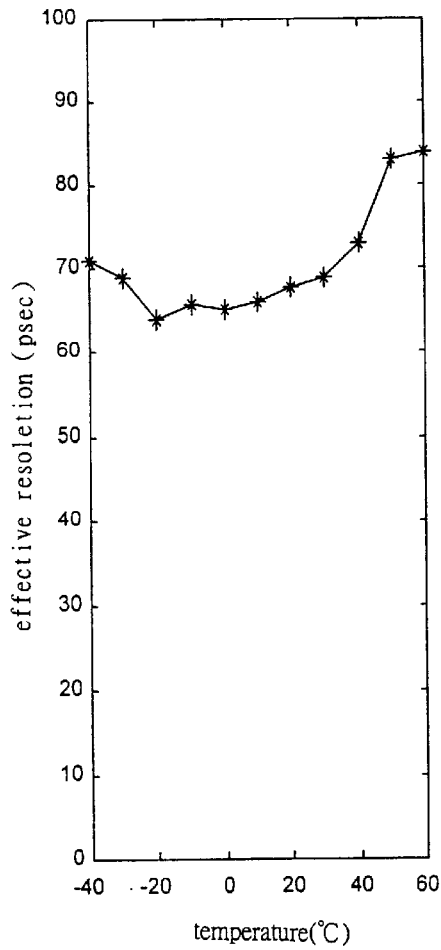
Figure 14B:
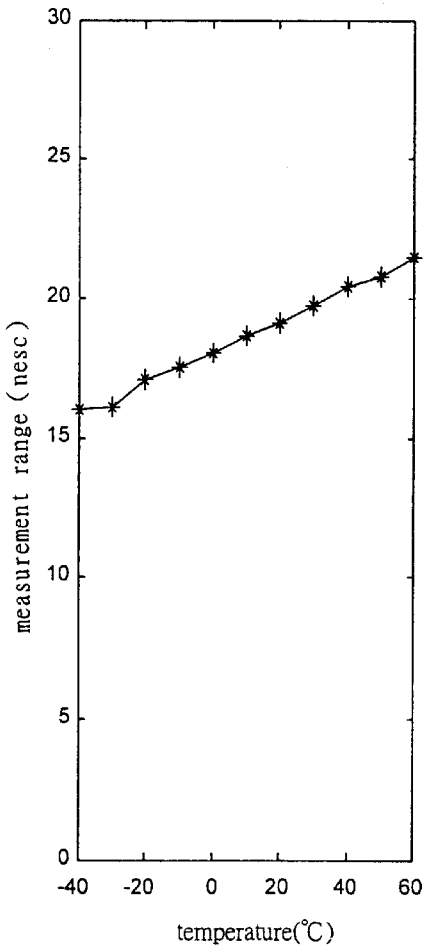

FIG. 14 shows the temperature sensitivity of the present cyclic CMOS TDC. Another series of temperature dependence experiments were conducted similarly. The effective resolution was calibrated for every other 10° C. The present TDC retains resolution of around 65~72 picoseconds for −20° C. to 40° C. ambient temperature range. It is rather temperature insensitive.

Figures 15, 16:
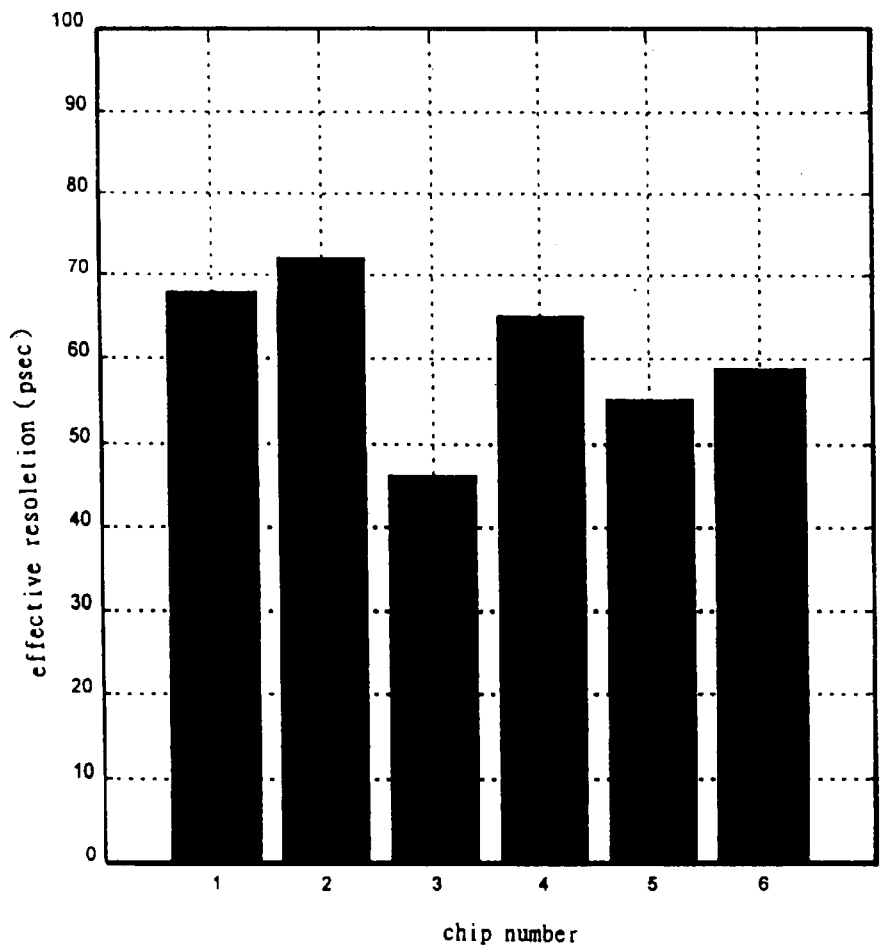
FIG. 15 is a bar graph the resolution distribution of realized ICs of the cyclic CMOS TDC based on the present element.
FIG. 16 is a detailed function assessment of the representive TDCs.

FIG. 15 illutrates the resolution distribution of the realized ICs of the present cyclic CMOS TDC. To test the robustness of the fabricated TDC, the effective resolution of the other five available chips, numbered from 2 to 6. are measured to investigate the influence of the process variation. The effective resolutions reveal a satisfactory range of 46~72 picoseconds.

Function assessments of the representative TDCs are listed in FIG. 16 for reference.

In comparison with prior CMOS delay elements, the advantages of the CMOS pulse shrinking delay element with deep subnanosecond resolution of this invention can be summarized as:

1. Converting the pulse shrinking delay element of the linear time-to-digital converter from analog type into digital type elements the problems in bias voltage adjustment, continuous calibration, and trial-and-error design process.
2. The shrinking or expanding capability of the cyclic CMOS TDC based on this invention is controlled by the dimension ratio between the inhomogeneous gate and its adjacent elements. No DLL is needed for continuous calibration, and the circuit can be greatly simplified to reduce chip size, power consumption, and to improve the resolution and accuracy.
3. The delay element of the invention is insensitive to supply voltage and ambient temperature variations.

Based on the above description, although at least one preferred embodiment has been elucidated with reference to relating drawings annexed, it is apparent that numerous variations or modifications may be made without departing from the true spirit and scope thereof, as set forth in the following claims.

REFERENCES

[1] K. Määttä, J. Kostamovaara. M. Koskinen, and R. Myllylä, "Time-to-digital converter for fast, accurate laser range finding," in Proc. SPIE Industrial Inspection, September 1988. vol. 1010, pp. 60–67.
[2] A. Rothermal hid F. Dell'ova "Analog Phase Measuring Circuit or Digital CMOS IC's," IEEE JSSC, vol. 28 No. 7, pp. 853–856, July 1993.
[3] Rapeli et al. "Method and circuitry for demdulation of angle modulated signals by measuring cycle time," U.S. Pat. No. 5,270,666, December 1993.
[4] Elvi Räisänen-Ruotsalainen, etc. "A Low-Power CMOS Time-to-Digital Converter," IEEE JSSC, vol. 30 No. 9, pp. 984–990, September 1995.
[5] Timo E. Rahkonen, etc. "The use of stabilized CMOS Delay Lines for the Digitization of Short Time Intervals," IEEE JSSC. vol. 28. No. 8, pp. 887–894, August 1993.
[6] Poki Chen, Shen-Iuan Liu and Jingshown Wu, "A low Power High Accuracy CMOS Time-to-Digital Coniverter," ISCAS'97, vol. 1, pp. 281–284, June 1997.
[7] Kalisz R. Szplet, J. Pasirbinski, and A. Poniecki. "Field-programmable-gate-array-based time-to-digital converter with 200-ps Resolution," IEEE Trans. IM, vol. 46, pp. 51–55. February 1997.
[8] T. A. Demiassa, and Z. Ciccone, "Digital Integrated Circuits," John Wiley & Sons, Inc., 1996.

What is claimed is:

1. A cyclic CMOS Time-to-Digital Converter with deep subnanosecond resolution, comprising:

a realized coupling control circuit composed of first and second control circuit NAND gates, wherein the first control circuit NAND gate couples an input pulse and a loopback output pulse to the beginning of a cyclic delay line for a next pulse shrinking cycle, and the second control circuit NAND gate provides a RESET input terminal for resetting said cycling delay line back to a correct stable state; and a counter used to count the circulation times of the input pulse in said cyclic delay line, said circulation times representing a measurement output of said Time-to-Digital Converter, wherein said cyclic delay line is composed of an even number of homogeneous NOT gates and said first and second control circuit NAND gates.

* * * * *